United States Patent
Verboom et al.

(10) Patent No.: US 6,891,868 B2
(45) Date of Patent: May 10, 2005

(54) LASER DRIVER WITH NOISE REDUCTION FEEDBACK FOR OPTICAL STORAGE APPLICATIONS

(75) Inventors: Johannes J. Verboom, Colorado Springs, CO (US); Jeffrey M. Brooke, Colorado Springs, CO (US); Gary L. Kline, Colorado Springs, CO (US)

(73) Assignee: Plasmon LMS, Inc., Colorado Springs, CO (US)

( * ) Notice: Subject to any disclaimer, the term of this patent is extended or adjusted under 35 U.S.C. 154(b) by 292 days.

(21) Appl. No.: 09/851,287

(22) Filed: May 8, 2001

(65) Prior Publication Data

US 2002/0167980 A1 Nov. 14, 2002

(51) Int. Cl.⁷ ................................................. H01S 3/00
(52) U.S. Cl. .................................. 372/38.08; 372/38.02
(58) Field of Search ............ 372/26, 32, 29.011–29.02, 372/38.01–38.09, 102, 9, 20, 33; 250/227; 341/143; 356/350, 28.5, 506; 359/161; 364/13; 369/47.51, 53.17; 398/95, 122, 137

(56) References Cited

U.S. PATENT DOCUMENTS

| | | | |
|---|---|---|---|
| 4,114,180 A | | 9/1978 | Kayanuma |
| 4,150,402 A | | 4/1979 | Tietze et al. |
| 4,863,272 A | * | 9/1989 | Coccoli ...................... 356/350 |
| 5,250,796 A | | 10/1993 | Taguchi et al. |
| 5,253,267 A | | 10/1993 | Johnson |
| 5,303,250 A | * | 4/1994 | Masuda et al. ................ 372/9 |
| 5,307,337 A | | 4/1994 | Woloszczuk |
| 5,309,461 A | | 5/1994 | Call et al. |
| 5,313,448 A | | 5/1994 | Sukeda et al. |
| 5,329,395 A | * | 7/1994 | Endo et al. .................. 398/122 |
| 5,363,363 A | | 11/1994 | Gage |
| 5,471,449 A | * | 11/1995 | Kaneko et al. .......... 369/53.17 |
| 5,475,210 A | | 12/1995 | Taguchi et al. |
| 5,506,716 A | * | 4/1996 | Mihara et al. .............. 398/137 |
| 5,598,264 A | * | 1/1997 | Failes ......................... 356/506 |
| 5,602,806 A | * | 2/1997 | Arnett et al. .................. 364/13 |
| 5,675,568 A | * | 10/1997 | Hajjar et al. ............. 369/47.51 |
| 5,687,261 A | * | 11/1997 | Logan ......................... 385/24 |
| 5,723,856 A | * | 3/1998 | Yao et al. ................... 250/227 |
| 5,726,965 A | | 3/1998 | Hajjar et al. |
| 5,798,854 A | * | 8/1998 | Blauvelt ..................... 359/161 |
| 5,825,793 A | * | 10/1998 | Miyai et al. ................. 372/33 |
| 5,848,044 A | | 12/1998 | Taguchi et al. |

(Continued)

FOREIGN PATENT DOCUMENTS

| | | |
|---|---|---|
| JP | 56145534 | 12/1981 |
| JP | 58196630 | 11/1983 |
| JP | 63084178 | 4/1988 |

Primary Examiner—Minsun Oh Harvey
Assistant Examiner—Tuan N. Nguyen
(74) Attorney, Agent, or Firm—Oppenheimer Wolff & Donnelly LLP; Craig J. Lervick

(57) ABSTRACT

In order to provide a low noise laser beam, a noise reducing feedback network is provided which creates a noise reducing signal and provides that signal to the laser itself. In order to produce the noise reducing signal, the operation of the laser is monitored and the feedback signal is a direct result of this monitoring. Monitoring is accomplished by a fast-forward sense detector, which receives a portion of the laser beam from the operating laser. The output from this fast-forward sense detector is provided to an amplifier which inverts and amplifies the signal. A noise reduction feedback network then receives the amplified signal, appropriately filters this signal, and provides it to the laser itself so as to reduce noise in the laser-beam for the frequency band of importance for reading the recorded data from the optical medium. The noise reduction feedback signal further has sufficiently high impedance so as to not disturb the traditional CW operation of the laser and to avoid interference with the traditional RF modulation of the laser.

25 Claims, 7 Drawing Sheets

U.S. PATENT DOCUMENTS

| | | | |
|---|---|---|---|
| 5,886,802 A | * 3/1999 | Majima | 398/95 |
| 5,898,656 A | 4/1999 | Takiguchi | |
| 6,026,071 A | 2/2000 | Kimura | |
| 6,167,066 A | * 12/2000 | Gaeta et al. | 372/102 |
| 6,222,861 B1 | * 4/2001 | Kuo et al. | 372/20 |
| 6,233,045 B1 | * 5/2001 | Suni et al. | 356/28.5 |
| 6,304,200 B1 | * 10/2001 | Masuda | 341/143 |
| 6,501,773 B1 | * 12/2002 | Volz et al. | 372/29.02 |

* cited by examiner

LASER DRIVER WITH NOISE REDUCTION FEEDBACK FOR OPTICAL STORAGE APPLICATIONS

BACKGROUND OF THE INVENTION

The present invention relates to optical data storage devices. More specifically, the present invention relates the control and operation of the laser used in optical data storage systems to produce a low noise optical signal for use in reading data from the optical media.

Since the launch in 1982 of the audio CD, optical disks have become a very popular storage media due to their durability, random access features, and the high capacities that can be achieved on a single removable disk. The computerization of businesses has also steadily increased the amount of data that is processed. As more data is processed, the amount of data which must be stored increases as well. To meet the need of this ever-increasing amount of data, cost-effective data storage is desired. To remain competitive and to meet the needs for storage, increasing the disk capacity is a paramount development goal for optical drive products. (See, P. Asthana, B. I. Finkelstein, and A. A. Fennema, "Rewritable optical disk drive technology," IBM Journal of Research and Development, Vol. 40, No. 5 (1996)).

As is well known, data on optical disks is stored by altering the physical properties of the optical media at defined locations. The optical media can be altered either at a factory where storage media is mass-produced, or, within the optical drive itself. Most often, the optical media is in the form of an optical disk.

For both reading and writing of information, the optical storage device utilizes a laser positioned adjacent the storage media. In the write mode, the laser is used to alter the physical properties of the media at the desired locations. Conversely, in the read mode the laser is used to illuminate the storage media surface and detect the physical surface property at the desired location. The operation and performance of the laser in both the read and write modes is critical to the efficient operation of the storage device.

As suggested above, the storage capacity of storage devices is a continuing concern. It is always desirable to store more information on a single device, rather than having to spread this across multiple devices.

One way to achieve higher storage capacity is to increase the density of information. In the case of optical storage devices, this is achieved by placing data points closer to one another on the optical media. In order to create a useful storage device however, it is critical to be able to differentiate between the various data points. Thus, data points can potentially be placed too close together, resulting in meaningless information.

The optimum placement of data points on the optical media is largely controlled by the type of laser used, and its related focal point. Obviously, the optics and lasers have limits which affect the density achievable on the storage media. If the density is excessively increased, the integrity of the data will be compromised. Again, this results in unusable, inefficient data storage devices.

Newer lasers and compatible storage media have recently made higher density data storage possible. For example, violet lasers (approximately 405 nm wavelength) have a much sharper focal point and thus allow for more high density storage. However, these new lasers appear to generate more noise than previous lasers (e.g., red lasers operating at approximately 650 nm wavelength). With the newer lasers and tighter data density, noise in the laser itself can compromise the system's ability to differentiate between data signals and noise. Consequently, it is desirable to provide a very clean laser beam, free of any significant noise, in order to make higher density optical storage possible.

Commercially available laser driver circuits provide one mechanism to control the laser itself. Specifically, the laser drive is typically used as part of a close loop low frequency (LF) control system to provide appropriate continuous wave (CW) laser-power to the media. This type of control is specifically used to control the laser during read operations. In these systems, part of the collimated laser beam is diverted to a photo detector which monitors the laser's output. The output from this photo detector is then fed back to a digital signal processor or to an analog control loop, for laser read power control. In turn, the digital signal processor provides signals to the laser driver to appropriately adjust the read power.

One function of the laser driver is to provide a controlled current source to drive the laser. The supplied current is dependent upon various signals provided to the laser driver. The laser driver itself includes some internal noise which results in noise on it's output signal. Additionally, the laser itself is also known to generate some noise as well. Consequently, any effort to control and minimize the noise created by these two sources is a beneficial improvement.

The noise problems outlined above is further exaggerated by the typical operating environment of an optical storage system. More specifically, optical storage devices typically include RF modulation in order to keep the lasers operating in a stable and quiet mode. Generally speaking, noise in the laser is minimized by utilizing higher amplitude RF modulation signals. However, use of these high amplitude RF signals is often prohibited due to RF emission requirements. Consequently, lasers are typically operated with non-optimal RF levels, which will create an additional noise problem with the new violet lasers. This simply highlights the benefits of laser noise reduction at virtually all levels.

SUMMARY OF THE INVENTION

The present invention allows for high density data storage by minimizing all noise created by the laser driver and/or the laser itself. In summary, this is accomplished by monitoring the laser signal and creating a noise cancellation feedback loop which feeds directly into the laser. This noise elimination technique allows for the use of the newer, shorter wavelength lasers and compatible data storage media (e.g., violet laser operating at 405 nm wavelength). The feedback loop provides a noise elimination signal which is fed directly back into the laser, thus all noise is dealt with at that level, eliminating the need for additional optical modulators or similar components.

In one embodiment of the low noise laser control of the present invention, the laser itself is driven by a laser driver circuit. While various circuits could be used, one laser driver that is appropriate for this function is an Elantec EL6287C laser driver. Generally speaking, the laser driver includes a current source which is connected to the laser itself such that a controlled laser beam is created in response to the controlled drive current provided.

In order to monitor the laser output, appropriate optics are used to divert a portion of the laser beam to a photo detector. In this case the photo detector is a fast-forward sense detector (fast FSD) which outputs an electrical signal proportional to the laser power. This output is provided to a low noise, high bandwidth trans-impedance amplifier which produces a signal voltage at its output which is simply an inverted and amplified representation of the fast FSD current. The output from the trans-impedance amplifier is then provided to a digital signal processor (DSP) for CW laser power control, and other functions. Based on the amplitude of this amplified forward sense signal (from the trans-impedance amplifier), the digital signal processor then provides a read power control signal back to the laser driver to control the appropriate laser current in order to achieve sufficient signal strength from the laser.

In order to reduce noise in the laser output, a noise reduction feedback network is connected between the trans-impedance amplifier and the laser. A noise reduction signal is created by this noise reduction feedback network and provided to the input of the laser itself.

As mentioned above, the amplified forward sense signal is simply an amplified and inverted signal voltage derived from the laser output beam. The noise reduction feedback network filters this amplified signal to isolate the noise contained therein, which is primarily the medium frequency component. By providing this filtered and inverted signal back to the laser itself, noise cancellation is achieved at frequency components within the read channel bandwidth of the system.

In summary, the invention measures the noise from the light produced by the laser, using a fast photo detector, and feeds filtered, amplified and inverted noise reduction signal back to the laser. This feedback cancels noise in the read-channel bandwidth without disturbing the CW read power control provided by the digital signal processor.

When the laser is used to write data to the optical media, the laser is necessarily driven at various frequencies (i.e., write pulses are created). In order to not disturb the operation of the laser during the write operations, the noise reduction feedback network is appropriately disabled through an appropriate switch. Specifically, the noise reduction feedback network is switched off, or disabled during any write operations.

Generally speaking, the noise reduction feedback network displays two primary characteristics: (1) appropriate frequency response to provide noise canceling while also not affecting LF response; and (2) high impedance so that the current provided by the laser driver is not affected.

As can be anticipated, there are several circuits which can achieve the desired functionality of the feedback network. In a first embodiment, the feedback network is simply an RCL network connected in series to provide a band-pass function. The band-pass function is chosen in order to not disturb the CW operation of the laser and to avoid interference with the generally used RF modulation, which is typically in the frequency range of 200 to 600 MHz.

As previously mentioned, the feedback network is also switched so that it may be disabled during write operations. Ideally, the switch would have a very low on resistance in order achieve good feedback and would be controlled by the digital signal processor. Consequently, a reed relay switch is best used for this embodiment, due to it's low on resistance.

In an alternative embodiment, the noise reduction feedback network includes a transistor amplifier network to provide appropriate impedances and additional feedback gain for better noise cancellation. The output from the trans-impedance amplifier is high-pass filtered and fed back to the laser using a capacitor and this transistor amplifier input impedance. This high-pass filtering provides appropriate medium frequency feedback, while avoiding any disturbance of the CW power control. Because of the high output impedance of the transistor providing the feedback current, the inductor can be eliminated from the feedback network, as the RF signal current, provided by the conventional laser driver circuit, will fundamentally flow into the much lower impedance of the laser. In order to prevent RF signal cancellation, the bandwidth of the feedback network must be limited to a frequency below the RF frequency. This is easily accomplished by limiting the bandwidth of the trans-impedance amplifier for the FSD-current to about 100 MHz.

Additionally, because of the higher input impedance provided by the transistor amplifier network, a FET switch can be used to control the disabling of this network. This is desirable as it provides higher switching speed for the disabling switch and FET-switches offer better reliability than reed-relays.

While a digital signal processor is typically used to provide CW read level control, it is possible to create a self contained control loop which would provide both noise reduction and CW read power control. In this embodiment, the same AC coupled transistor amplifier network is utilized in the feedback network. However, additional amplifiers are provided to provide CW power control, as opposed to the digital signal processor.

The noise reduction feedback network compliments the existing low frequency control loop to provide a much broader range of noise reduction. The conventional DC control loop (either by DSP or analog) typically provides low-frequency noise reduction (typically for frequencies below 10 kHz). The new noise reduction feedback-circuit provides medium-frequency noise reduction (typically from 10 kHz to approximately 40 MHz), which is beneficial for the read-channels of optical drives. Specifically, information read from the storage media is typically within this medium frequency bandwidth, so this noise reduction produces the most beneficial results.

As suggested above, it is an object of the present invention to provide significant noise reduction in the laser beam output. This reduction in laser noise will in turn allow for the use of shorter wavelength lasers, and higher data density on the storage media.

It is a further object of the present invention to provide medium frequency noise reduction while also not affecting CW read power control. This CW read power control is typically provided by a digital signal processor, however, may be provided by discrete circuitry.

It is an additional object of the present invention to provide selective noise reduction such that the write operations are not affected. To achieve this, it is desirable to utilize a switched feedback network that can be selectively disabled.

It is yet another object of the present invention to provide noise reduction directly to the laser itself, without requiring additional circuitry such as light modulators, etc.

It is still a further object of the present invention to utilize standard laser driver circuits in conjunction with the noise reduction methodology. Due to the feedback as setup by the present invention, any noise created by the laser driver circuit itself is also minimized.

BRIEF DESCRIPTION OF THE DRAWINGS

Further objects and advantages of the present invention can be seen by reading the following detailed description in conjunction with the drawings in which.

DETAILED DESCRIPTION OF THE INVENTION

Figure 1:
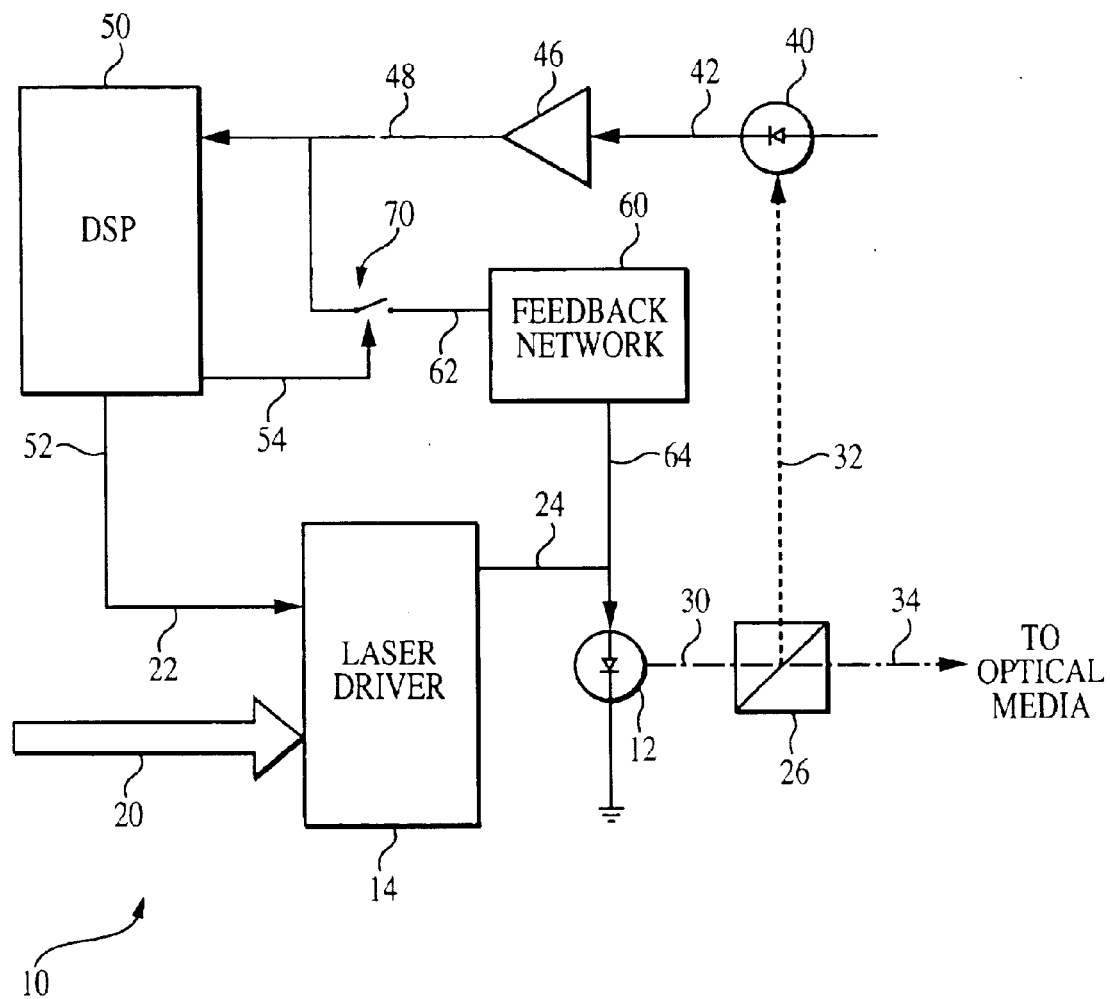
FIG. 1 is a block diagram illustrating the concept of the present invention.

Referring to FIG. 1, there shown a schematic diagram illustrating the preferred embodiment of the low noise laser control system 10 of the present invention. As described and illustrated below, laser control system 10 is used in an optical data storage system. It is certainly contemplated that this control system 10 could easily be used with other devices that require noise free operation of a laser.

As with all optical data storage systems, a laser 12 is utilized to generate light signals for reading and writing operations. Laser 12 is controlled by a laser driver 14, which has a write control signal input 20 and a read power input 22. Both of these inputs control the output signal generated at laser driver output 24. Laser driver output 24 is directly attached to laser 14 in order to generate the desired optical signals. The laser driver of the preferred embodiment is a commercially available Elantec EL6287C laser driver manufactured and sold by Elantec Semiconductor, Inc. of Milpitas, Calif. It will be understood that other laser drivers may be used and the present invention is not limited to this particular laser driver. In summary, this device will provide all necessary laser driving functions, including appropriate current supply and any necessary RF modulation.

The laser signal 30 (i.e. laser beam or optical signal) generated by laser 12 is presented to a beam splitter 26 which diverts a feedback optical signal 32 to a photo detector 40. Beam splitter 26 also allows a primary optical signal 34 to be directed to the related storage media (not shown) such as an optical storage disk. In order to operate most efficiently, beam splitter 26 is configured so that primary optical signal 34 is much stronger than feedback optical signal 32.

Photo detector 40, also referred to as forward sense detector (FSD) 40, is a fast responding photo detector which produces an electrical current indicative of the optical signal received at output 42. A low noise, high bandwidth trans-impedance amplifier 46 is connected to output 42 and is configured to create a voltage signal which is an inverted and amplified representation of the signal created by photo detector 40. Trans-impedance amplifier output 48 is connected to a digital signal processor 50 (DSP). Digital signal processor 50 receives the amplified forward sense signal from trans-impedance amplifier 46, which includes information regarding the laser signal strength. The LF component of trans-impedance amplifier output 48 indicates the CW power being generated by laser 12. In response, digital signal processor 50 generates a control signal at LF output 52, which is connected to read power input 22 of laser driver 14. Through these components, a LF control loop is created for appropriately adjusting the intensity or CW power level of laser 12 and the associated laser signal 30. While this embodiment includes this LF control, it is understood that other power control schemes could be used, including other closed and open loop control methods.

In order to provide noise reduction to the laser signal, a noise reduction feedback network 60 is attached between laser 12 and trans-impedance amplifier output 48. In order to provide selective operation of noise reduction feedback network 60, a control switch 70 is connected between trans-impedance amplifier output 48 and the input 62 of noise reduction feedback network 60. Noise reduction feedback network 60 further has a feedback network output 64 which is connected directly to laser 12.

Generally speaking, noise reduction feedback network 60 is utilized to provide a noise canceling signal on feedback network output 64. This noise canceling signal is an inverted signal indicative of the actual noise detected in laser signal 30. By adding this inverted signal to the laser driver output signal, substantial noise cancellation will be achieved.

Noise reduction feedback network 60 provides AC coupling to the laser 12 so that the LF control provided by DSP 50 is not affected. Also, noise reduction feedback network 60 displays very high impedance, so that signals generated on laser drive output 24 are directed towards the laser, and not back into noise reduction feedback network 60.

As mentioned above, noise reduction feedback network 60 is selectively operable through the use of switch 70. Specifically, it is desirable to disable the noise reduction feedback network 60 during any writing operations. As is well known, writing operations often include various high frequency components. Consequently, it is desirable to avoid any high frequency affects that noise reduction feedback network 60 generates during these writing operations. In order to selectively operate noise reduction feedback network 60, switch 70 is controlled by digital signal processor 50. Specifically, digital signal processor 50 includes a write mode output 54 which operates switch 70.

While certain operations are shown in FIG. 1 to be accomplished by digital signal processor 50, it is clearly understood that various other components or control methodologies could be used to accomplish the same result. As will be shown later, discrete components may provide the actual CW read power control. Further, the write mode signal, and operation of switch 70, may be controlled by other components within an optical drive system. All of these variations are clearly contemplated to be part of the present invention.

Figure 2:
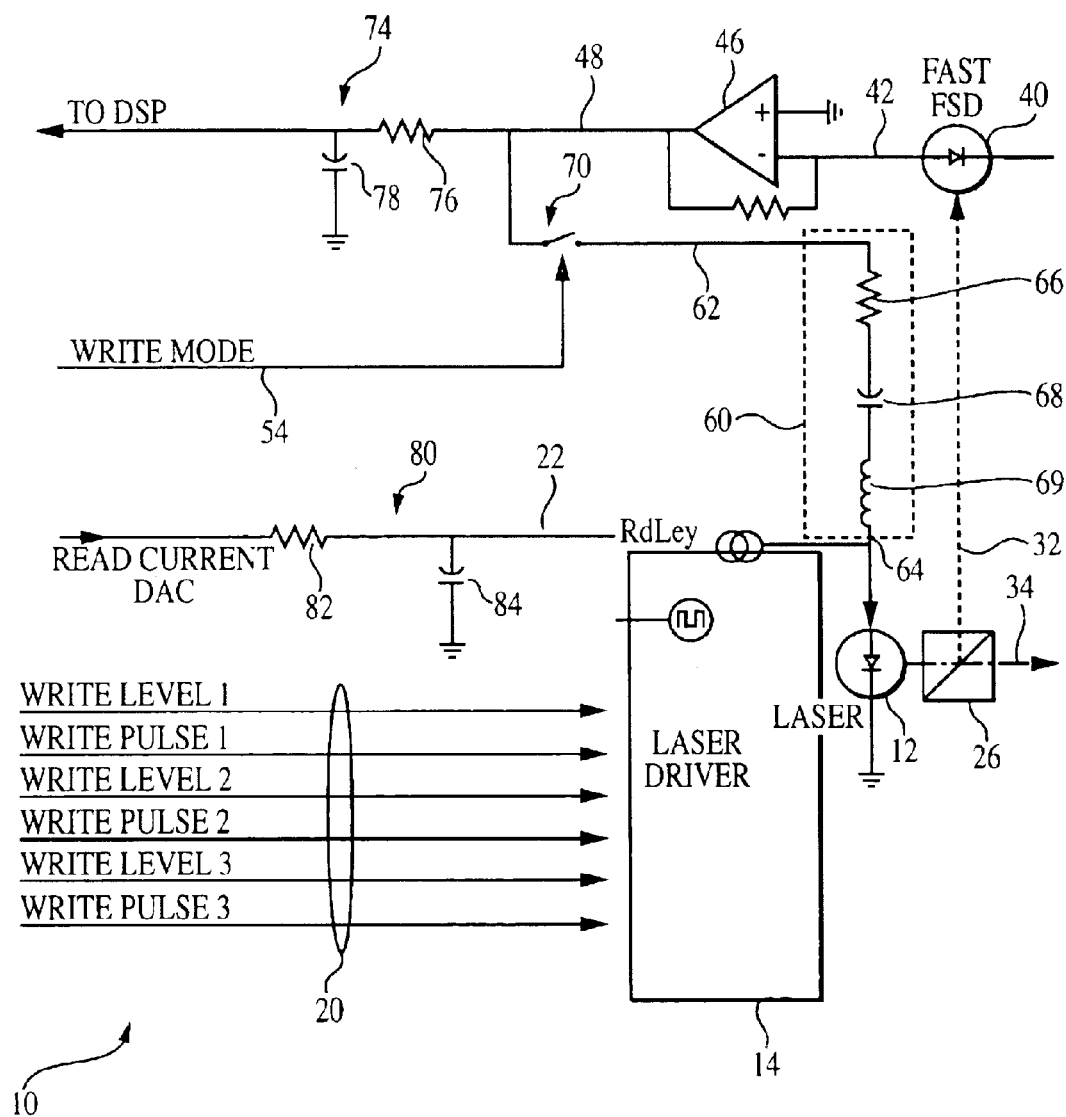
FIG. 2 is a schematic diagram illustrating one embodiment of the present invention.

Referring now to FIG. 2, there shown a more detailed schematic diagram of the low noise laser control system 10. Note that in all the figures, like components have retained like numbers.

FIG. 2 more specifically shows one embodiment of noise reduction feedback network 60. In this embodiment, noise reduction feedback network 60 is simply an RCL network including resistor 66, capacitor 68, and inductor 69. Capacitor 68 provides appropriate AC coupling so that only signals of sufficient frequency are transmitted to laser 12. Inductor 69 provides the necessary high impedance so that the operation of laser driver 14 is not adversely affected. Lastly, resistor 66 provides stability so that noise reduction feedback network 60 will not oscillate.

In the embodiment shown in FIG. 2, switch 70 is best embodied as a reed relay switch. This reed relay switch is preferred as it has very low on resistance and provides for sufficient noise reduction operation.

Also shown in FIG. 2 is a RC filter 74 connected between trans-impedance amplifier output 48 and digital signal processor 50 (DSP not shown in FIG. 2). RC filter 74 includes a filtering resistor 76 and filtering capacitor 78. These components ensure that only LF components of the amplified photo detector signal present at trans-impedance amplifier output 48 is passed on to digital signal processor 50. Similarly, a second RC filter 80, made up of second filtering resistor 82 and second filtering capacitor 84, is connected at the input of laser driver 14. Again, this simply ensures that only LF signals are provided on this input 22.

Figure 3:
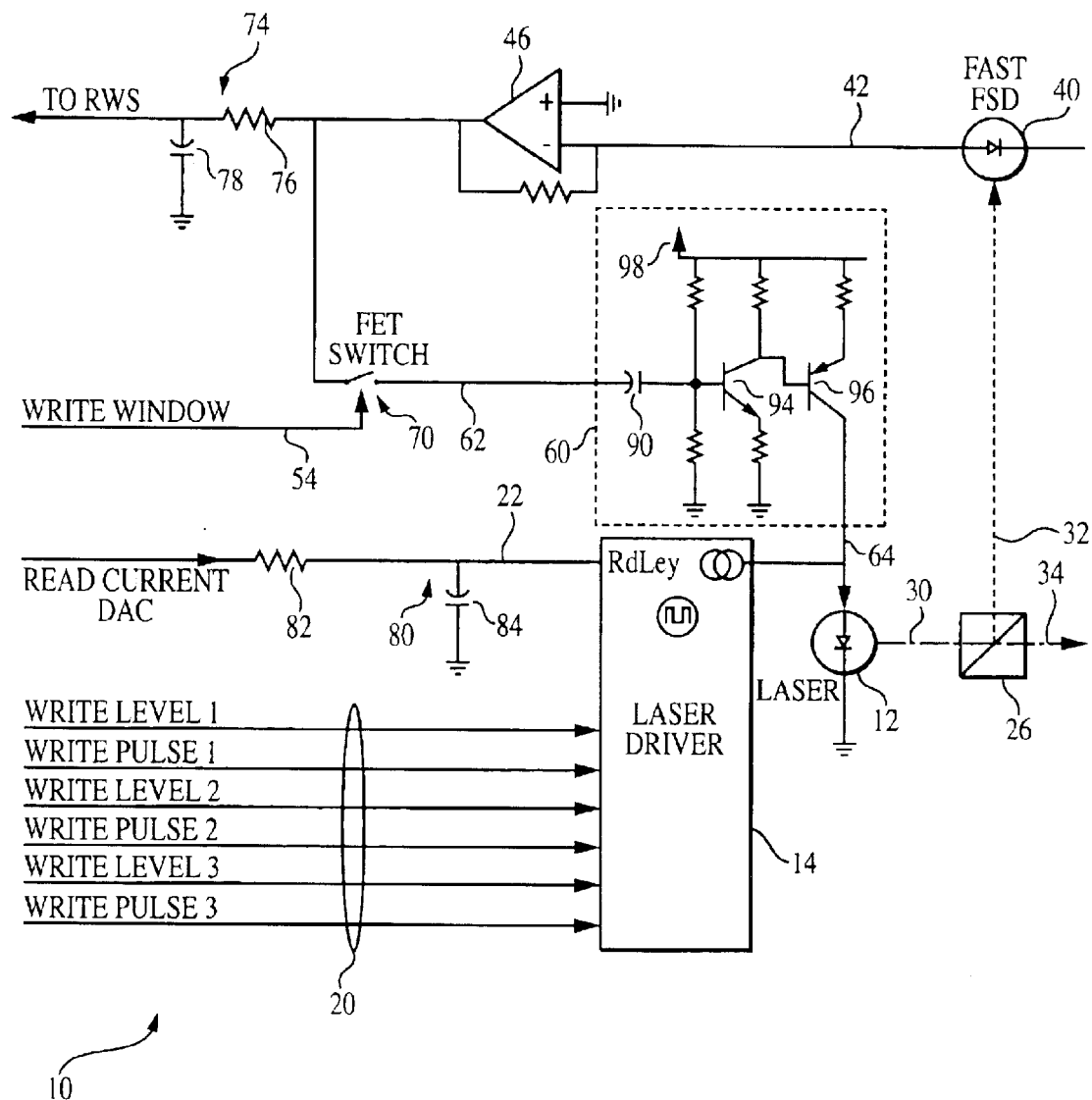
FIG. 3 is a schematic diagram illustrating a second embodiment of the present invention.

Referring now to FIG. 3, there shown yet another embodiment of the low noise laser control system of the present invention. Generally speaking, the same overall control methodology as described above is utilized, however a different noise reduction feedback network 60 is used. Specifically, laser driver 14 is utilized to control laser 12. Through the use of beam splitter 26, photo detector 40, trans-impedance amplifier 46 and noise reduction feedback network 60, a noise reduction signal is generated at feedback network output 64. This noise reduction signal is then connected back to the input of resistor 12 for the purpose of canceling noise.

In the embodiment shown in FIG. 3, an alternative noise reduction feedback network 60 is shown. In this embodiment, noise reduction feedback network 60 includes a capacitor 90 for use in providing AC-coupling. Additionally, a non-inverting transistor amplifier 92 is attached to coupling capacitor 90. Specifically, non-inverting transistor amplifier 92 includes a first transistor 94 and a second transistor 96. Both first transistor 94 and second transistor 96 are preferably high frequency transistors with acceptable bandwidth to provide the desired noise reduction. Also, both first transistor 94 and second transistor 96 are connected to a supply source 98. Second transistor 96 operates as a current source, thus providing high impedance for the laser and eliminating the need for the previously used inductor. Additionally, the non-inverting transistor amplifier 92 provides higher impedance for coupling capacitor 90, thus allowing an alternative switch 70 to be used. In this particular embodiment, a FET switch can be used as on resistance is less critical. More specifically, a fast FET switch can be used, which has faster switching speed than the previously discussed reed relay switch.

Figure 5A:
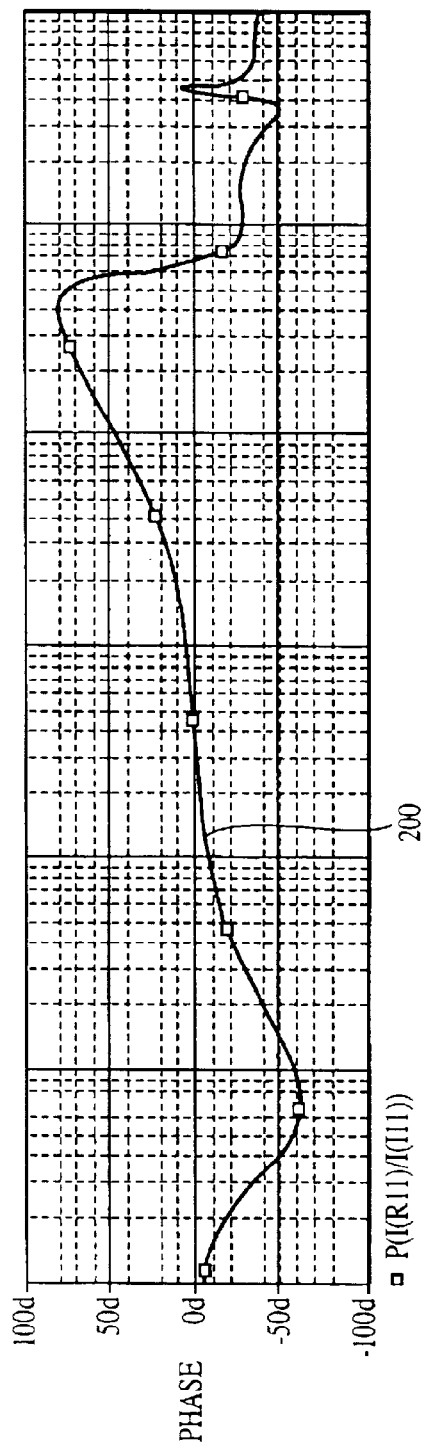
FIG. 5 is a graphical illustration showing the phase and noise reduction at various operating frequencies.

In order to illustrate the noise reduction and frequency characteristics of the circuitry, FIG. 5A illustrates the closed loop phase relationship versus frequency for noise reduction laser control system 10 of FIG. 3. As can be seen, over the illustrated frequency range the phase relationship changes, due primarily to delays in the circuitry. Obviously, this phase relationship will effect the noise cancellation achieved. The actual phase relationship is shown by phase line 200 as illustrated.

Figure 5B:
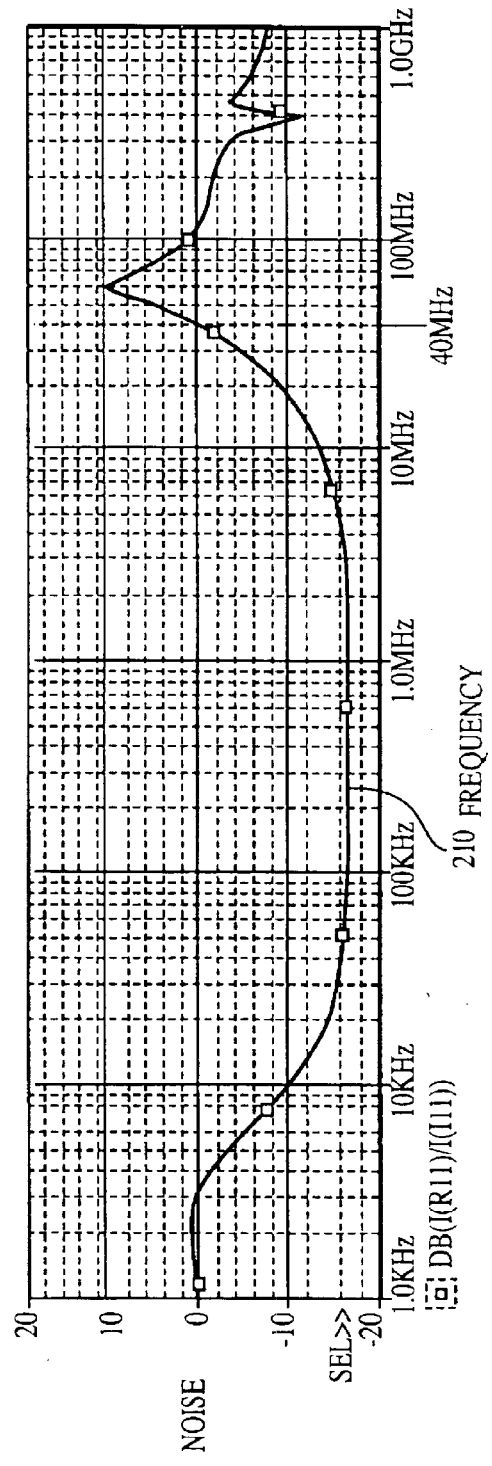

Next, the closed loop noise reduction is shown in FIG. 5B, as noise line 210. As can be seen, the noise starting at approximately 10 kHz, is reduced by more than 10 db, and maintains that lower level out through approximately 20 MHz. Noise continues to be reduced until approximately 40 MHz. As also shown in FIG. 5B, some noise magnification (peaking) is actually seen at higher frequencies. In the case of the optical data storage systems, this magnification is insignificant however, as this frequency is well above the operating bandwidth of the laser storage devices. Consequently, noise above this frequency level can be substantially reduced through the use of additional low pass filters in the read channel. Most importantly however, all noise in the relevant frequencies (i.e. the operating bandwidth of the optical storage systems) is reduced.

Figure 4:
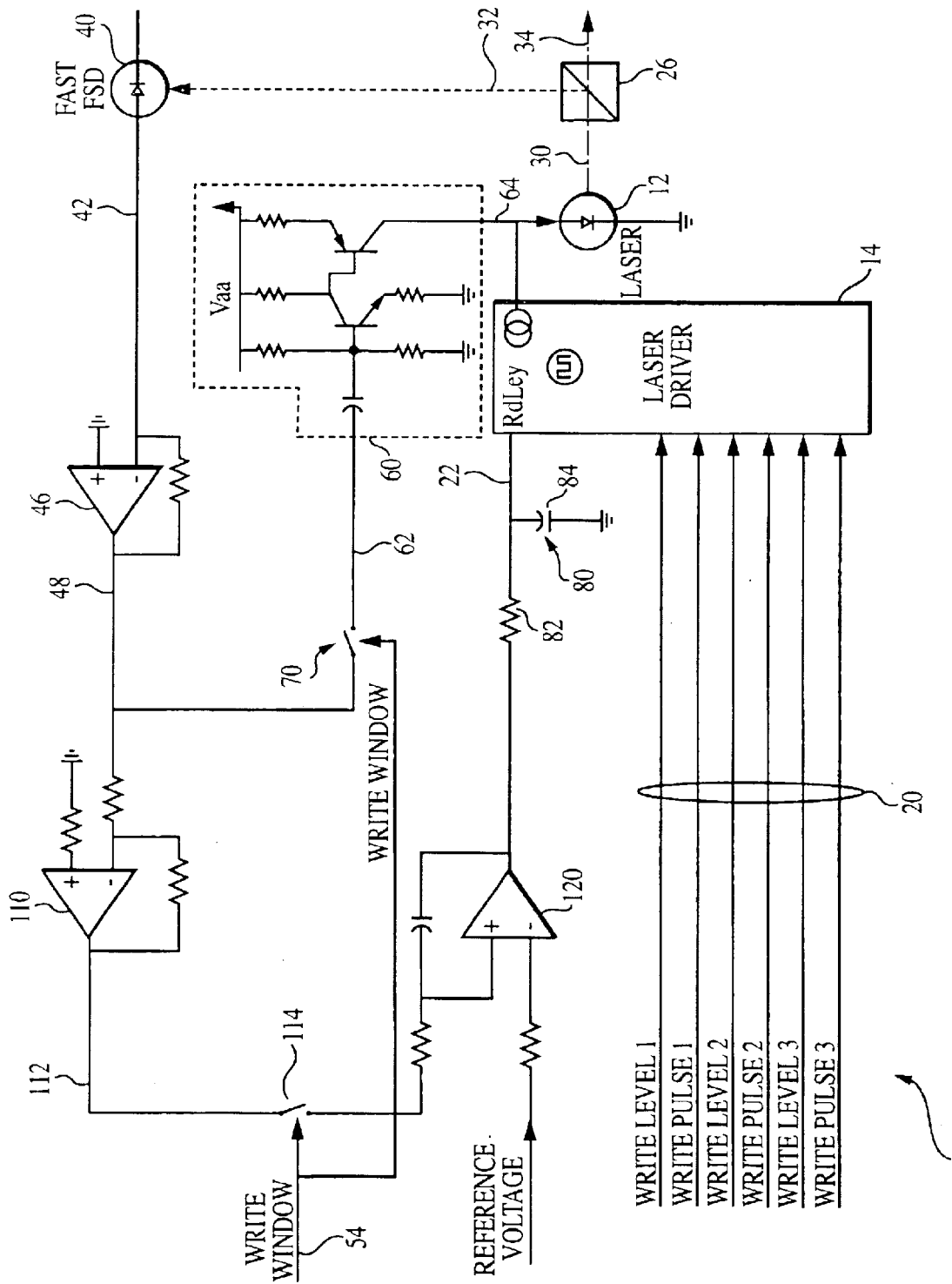
FIG. 4 is a schematic diagram illustrating yet another embodiment of the present invention, wherein a digital signal processor is eliminated.

Referring now to FIG. 4, there shown an alternative embodiment of the present invention which does not require the use of a digital signal processor for CW power control. In this particular embodiment, the digital signal processor has been replaced by a first amplifier 110 and a second amplifier 120. First amplifier 110 includes a simply feedback network to allow amplification of the signal present on trans-impedance amplifier output 48. A first amplifier output 112 is provided to second amplifier 120 via switch 114. First amplifier 110 and second amplifier 120, along with all accompanying circuitry, are configured to provide a LF control loop, much the same as carried out by the digital signal processor 50 shown in FIGS. 1–3. Additionally, switch 114 provides a mechanism to selectively operate both noise reduction feedback network 60 and this LF control loop.

Referring now to FIGS. 6A–6D, the improvement achieved by utilizing the feedback network 60 of the present invention is better illustrated. FIGS. 6A–6D illustrates the signal outputs from the storage device read channel when actual data is read from the optical storage device. In each of these figures (FIGS. 6A–6D) no data is read during an initial time $t_0$ and the read channel is simply being sampled. During time period $t_1$, a uniform data pattern is being read.

Figure 6A:
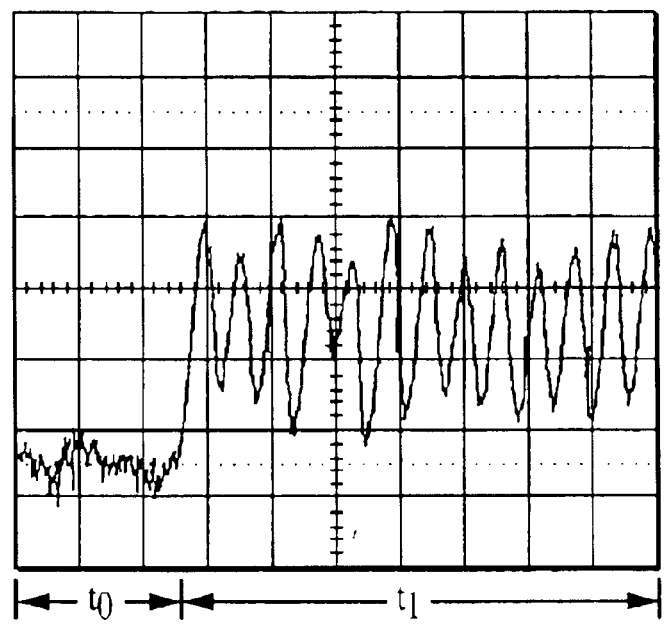
FIGS. 6A–6D are various data signal traces of the read channel output showing the noise reduction feedback disabled (FIGS. 6A and 6C), and the noise reduction feedback enabled (FIGS. 6B and 6D).
Figure 6B:
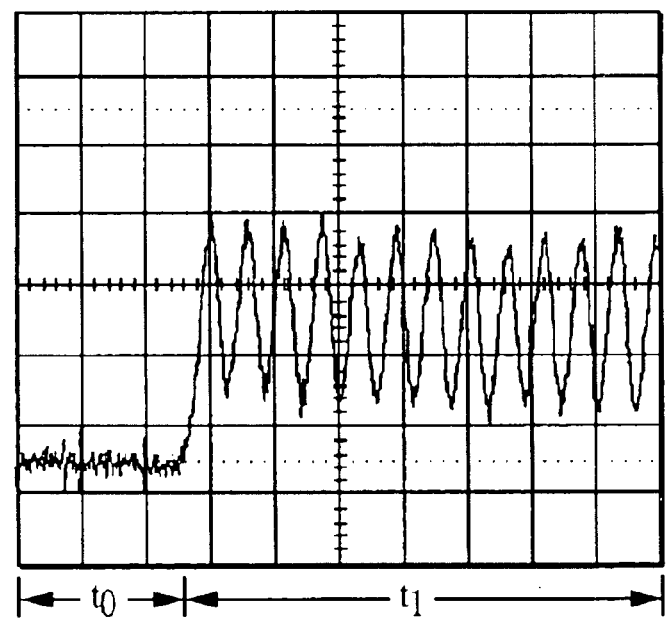

FIG. 6A illustrates a single trace data read with noise reduction feedback network 60 turned off. More specifically, switch 70, shown in FIG. 3 is open. Consequently, noise and uneven signal levels are created. In comparison, FIG. 6B shows a single trace of information being read with the noise reduction feedback network 60 turned on. As can be seen, the actual noise on the signal, and the peaked amplitude remains much more constant and repeatable.

Figure 6C:
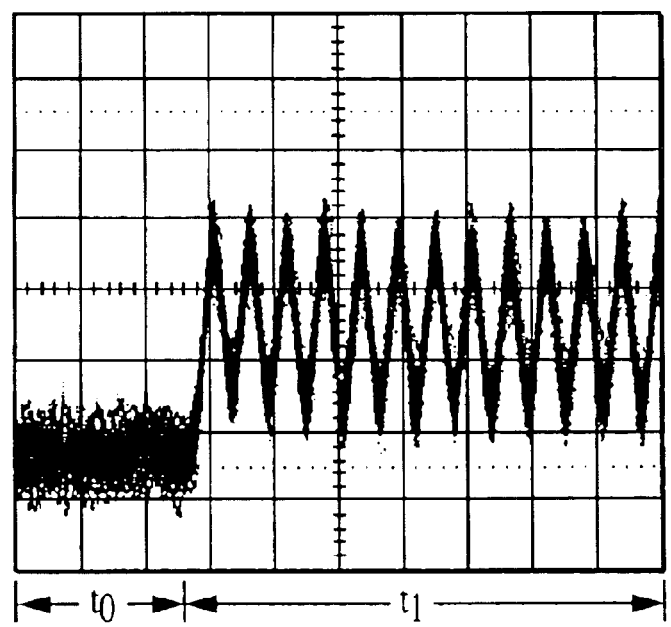
Figure 6D:
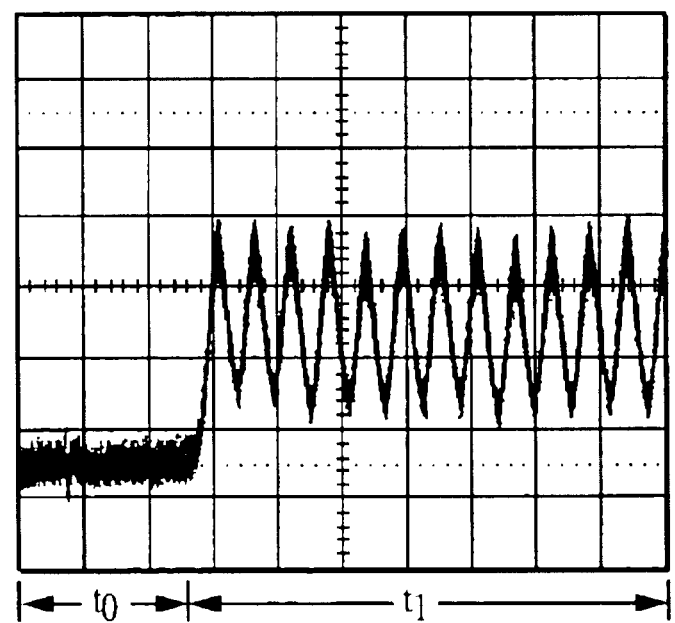

Similarly, FIGS. 6C and 6D illustrate multiple traces of data being read. Specifically, FIG. 6C illustrates multiple traces of data read with the noise reduction feedback network 60 turned off, while FIG. 6D illustrates multiple traces of data with the noise reduction feedback network 60 turned on. By comparing FIGS. 6C and 6D, the noise and signal repeatability is vastly improved when the noise reduction feedback is turned on.

Those skilled in the art will further appreciate that the present invention may be embodied in other specific forms without departing from the spirit or central attributes thereof. In that the foregoing description of the present invention discloses only exemplary embodiments thereof, it is to be understood that other variations are contemplated as being within the scope of the present invention. Accordingly, the present invention is not limited in the particular embodiments which have been described in detail therein. Rather, reference should be made to the appended claims as indicative of the scope and content of the present invention.

What is claimed is:

1. A laser noise control system operating in conjunction with a laser driver, wherein the laser driver produces a laser drive signal that is provided to a laser so as to produce an optical signal, the laser noise control system comprising:

a beam splitter positioned to receive the optical signal and output a first portion and a second portion thereof;

an optical sensor positioned to receive the first portion of the optical signal, the optical sensor thus capable of producing a sensor output signal indicative of the optical signal;

a noise reduction feedback network operatively connected to the optical sensor and to the laser, the noise reduction feedback network configured to include a filter circuit which receives the sensor output signal and produces a filtered noise reduction signal which is combined with the laser driver signal and provided to the laser;

a LF control loop operatively attached between the optical sensor and the laser driver to provide CW control of the laser; and a control switch to selectively operate the noise reduction feedback network.

2. The low noise laser control system of claim 1 further comprising a trans-impedance amplifier attached to an output of the optical sensor, the trans-impedance amplifier producing an amplified signal proportional to the optical sensor signal and providing the amplified signal to both the LF control loop and the noise reduction feedback network.

3. The low noise laser control system of claim 1 wherein the noise reduction feedback network is a series RCL circuit.

4. The low noise laser control system of claim 3 wherein the RCL circuit is configured to provide a band-pass function.

5. The low noise laser control system of claim 1 wherein the noise reduction feedback network is a high-pass transistor amplifier network.

6. The low noise laser control system of claim 2 wherein the LF control loop includes a processor attached to the trans-impedance amplifier, the processor further having an output attached to the laser driver, the processor output carrying a LF control signal which allows the laser driver to provide appropriate levels of current to operate the laser at a desired CW level.

7. The low noise laser control system of claim 6 wherein the noise reduction feedback network is a series RCL circuit.

8. The low noise laser control system of claim 6 wherein the noise reduction feedback network is a high-pass transistor amplifier network.

9. The low noise laser control system of claim 2 wherein the LF control loop includes an amplifier network attached to the output of the trans-impedance amplifier, the amplifier having an output attached to the laser driver, the amplifier output carrying a LF control signal which allows the laser driver to provide appropriate levels of current to operate the laser at a desired CW level.

10. A laser noise control system for use in controlling a laser within a data storage drive, comprising:
　a beam splitter positioned to receive a laser beam produced by the laser and direct a portion of the laser beam in a predetermined direction;
　an optical sensor positioned to receive the portion of the laser beam from the beam splitter and to produce a sensor output signal indicative of the laser beam;
　an amplifier attached to an output of the optical sensor for producing an amplified signal which is inverted with respect to the sensor signal;
　a noise reduction feedback network having a circuit connection between the amplifier and the laser in order to receive the amplified signal and to provide a filtered noise signal to the laser, wherein the filtered noise signal will cancel noise present in the laser beam; and
　a disabling switch for selectively disabling the feedback network, wherein the feedback network is disabled during writing operations of the data storage drive.

11. The control system of claim 10 wherein the noise reduction feedback network is a high pass high impedance network.

12. The control system of claim 10 wherein the noise reduction feedback network comprises a resistor, a capacitor, and an inductor all connected in series with one another.

13. The control system of claim 10 wherein the noise reduction feedback network comprises a transistor amplifier.

14. The control system of claim 10 wherein the optical sensor is a fast forward sense detector.

15. A laser control system attached to the read/write laser of an optical data storage system which is directed toward a data storage medium, the control system comprising:
　a laser driver attached to the laser for providing a laser drive signal which controls the operation of the laser;
　a beam splitter positioned to receive a laser signal from the laser and redirect at least a portion thereof;
　an optical sensor positioned to receive the portion of the laser signal redirected by the beam splitter and provide a sensor output proportional to the laser signal;
　an amplifier attached to the optical sensor for producing an amplified signal, the amplified signal being inverted and amplified when compared with the sensor output;
　a processor attached to the amplifier and the laser driver, the processor receiving the amplified signal and producing a laser control signal to control the intensity level of the laser; and
　a noise reduction feedback network having a circuit connection between the output of the amplifier and the laser, the noise reduction feedback network receiving the amplified signal and providing a cancellation signal to the laser in order to reduce the noise in the laser signal directed to the optical medium.

16. The laser control system of claim 15 further comprising a switch operatively connected to the noise reduction feedback network to provide for selective generation of the cancellation signal.

17. The laser control system of claim 15 wherein the noise reduction feedback network is a high pass and high impedance network.

18. The laser control system of claim 15 wherein the noise reduction feedback network comprises a resistor, a capacitor, and an inductor all connected in series with one another.

19. The laser control system of claim 18 wherein the resistor, capacitor and inductor are configured to provide a band-pass function.

20. The laser control system of claim 15 wherein the noise reduction feedback network comprises a transistor amplifier.

21. The laser control system of claim 15 wherein the optical sensor is a fast forward sense detector.

22. A laser noise reduction system for use in conjunction with a laser which is driven by a laser driver so as to produce an optical signal, the laser noise reduction system comprising:
　a beam splitter positioned to receive the optical signal and output a first portion and a second portion thereof;
　an optical sensor positioned to receive the first portion of the optical signal and to produce a sensor output signal indicative of the laser beam;
　a noise reduction feedback circuit having an input connected to the optical sensor so as to receive the sensor output signal and an output connected to the laser, the noise reduction feedback circuit having filtering circuitry and inversion circuitry which receives the sensor output signal and produces a noise reduction signal at the output which is an inverted and filtered version of the sensor signal;
　an LF control loop including a processor attached to a trans-impedance amplifier, the processor further having an output attached to the laser driver, the processor output carrying a LF control signal which allows the laser driver to provide appropriate levels of current to operate the laser at a desired CW level; and
　a control switch to selectively operate the noise reduction feedback network.

23. The laser noise reduction system of claim 22 wherein the noise reduction feedback circuit is a series RCL circuit.

24. The low noise laser control system of claim 22 wherein the RCL circuit is configured to provide a band-pass function.

25. The low noise laser control system of claim 22 wherein the noise reduction feedback network is a high-pass transistor amplifier network.

* * * * *